United States Patent
Kawamura et al.

(10) Patent No.: US 8,222,539 B2
(45) Date of Patent: Jul. 17, 2012

(54) WIRING BOARD AND METHOD FOR MANUFACTURING THE SAME

(75) Inventors: Yoichiro Kawamura, Ogaki (JP); Keisuke Shimizu, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 397 days.

(21) Appl. No.: 12/490,409

(22) Filed: Jun. 24, 2009

(65) Prior Publication Data

US 2010/0155124 A1   Jun. 24, 2010

Related U.S. Application Data

(60) Provisional application No. 61/140,749, filed on Dec. 24, 2008.

(51) Int. Cl.
*H05K 1/11* (2006.01)
(52) U.S. Cl. .................. 174/262; 174/255; 174/260
(58) Field of Classification Search .................. 174/260, 174/255, 262; 361/761–764, 783
See application file for complete search history.

(56) References Cited

U.S. PATENT DOCUMENTS

| | | | | | |
|---|---|---|---|---|---|
| 5,574,629 | A | * | 11/1996 | Sullivan | 361/767 |
| 5,811,847 | A | * | 9/1998 | Joshi et al. | 257/296 |
| 6,084,781 | A | * | 7/2000 | Klein | 361/771 |

FOREIGN PATENT DOCUMENTS

| | | |
|---|---|---|
| CN | 1365521 A | 8/2002 |
| CN | 1525804 A | 9/2004 |
| CN | 1945802 A | 4/2007 |
| JP | 10-79405 | 3/1998 |
| JP | 2002-151346 | 5/2002 |
| JP | 2004-296562 | 10/2004 |
| JP | 2004-335641 | 11/2004 |
| JP | 2005-217231 | 8/2005 |
| JP | 2006-032887 | 2/2006 |
| JP | 2007-073655 | 3/2007 |

\* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A wiring board has a conductive pattern, an electronic component connected to the conductive pattern by means of a via hole, and a substrate where the electronic component is built into. The connection interface between the via hole and the electronic component inclines toward the connection interface between the via hole and the conductive pattern.

20 Claims, 14 Drawing Sheets ically con-
WIRING BOARD AND METHOD FOR MANUFACTURING THE SAME

CROSS-REFERENCE TO RELATED APPLICATIONS

The present application claims the benefits of priority to U.S. Application No. 61/140,749, filed Dec. 24, 2008. The contents of that application are incorporated herein by reference in their entirety.

BACKGROUND OF THE INVENTION

1. Field of the Invention

The present invention is related to a wiring board having a built-in electronic component such as a resistor or a capacitor and a method for manufacturing such a wiring board.

2. Discussion of the Background

In Japanese Laid-Open Patent Application 2006-32887, a wiring board with built-in electronic components and its manufacturing method are described. In such a manufacturing method, a worker on the production line embeds electronic components inside a substrate, and electrinects conductive patterns of the substrate and terminal electrodes (electrode pads) of electronic components by means of via holes. Accordingly, a wiring board with built-in electronic components is manufactured. The contents of this publication are incorporated herein by reference in their entirety.

SUMMARY OF THE INVENTION

A wiring board according to one aspect of the present invention has a conductive pattern, an electronic component connected to the conductive pattern by means of a via hole, and a substrate where the electronic component is built into. The connection interface between the via hole and the electronic component inclines toward the connection interface between the via hole and the conductive pattern.

"The electronic component arranged inside" includes a case in which the entire electronic component is completely embedded inside a substrate as well a case in which only part of the electronic component is arranged in a hollow section formed in the substrate. In a word, it is sufficient for at least part of an electronic component to be built inside a substrate.

A method for manufacturing a wiring board according to another aspect of the present invention has the following: accommodating a warped electronic component inside a substrate; forming a via hole to be connected to a warped surface of the electronic component; and forming a conductive pattern to be connected to the electronic component by means of the via hole. The first to third steps may be conducted in any order.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
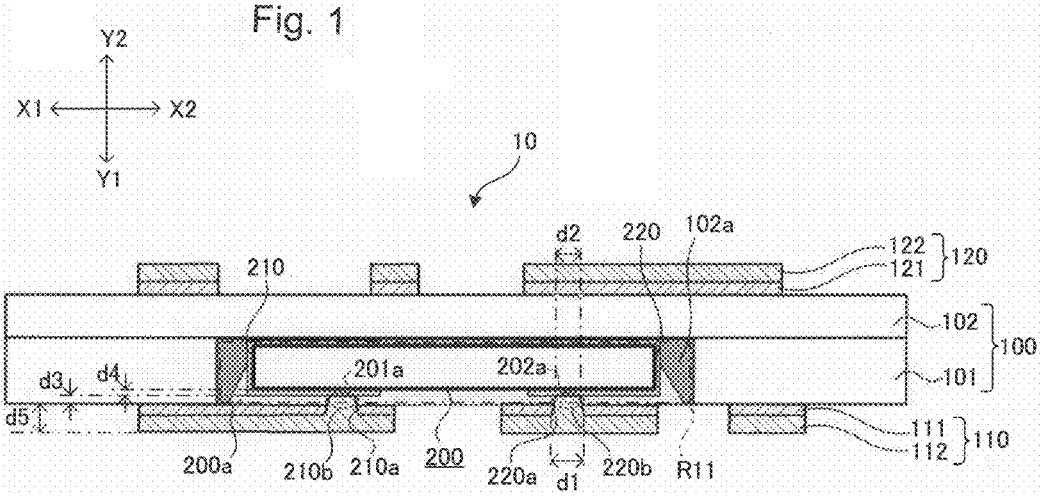
FIG. 1 is a cross-sectional view of a wiring board with a built-in electronic component according to Embodiment (1) of the present invention.

The embodiments will now be described with reference to the accompanying drawings, wherein like reference numerals designate corresponding or identical elements throughout the various drawings.

Embodiment (1)

Wiring board (10) with a built-in electronic component of the present embodiment has substrate (100), wiring layers (110, 120) as conductive patterns and electronic component (200), as shown in FIG. 1.

Substrate (100) is formed with rectangular insulation layers (101, 102) made of, for example, cured prepreg. Such prepreg is preferred to contain a reinforcing material such as glass cloth. The reinforcing material has a smaller thermal expansion coefficient than the main material (prepreg). Insulation layer (101) has space (R11) whose shape corresponds to the external shape of electronic component (200). Space (R11) will become a hollow section of substrate (100). The configuration or material of substrate (100) may be modified according to usage requirements or others. For example, as for prepreg, the following may also be used: glass-cloth base material or aramid-fiber base material impregnated with resin such as epoxy resin, bismaleimide triazine (BT resin), imide resin (polyimide), allyl phenylene ether resin (A-PPE resin) or the like. Also, instead of prepreg, thermosetting resins or thermoplastic resins in a liquid or film state may be used. As for thermosetting resins, for example, epoxy resin, imide resin (polyimide), BT resin, allyl phenylene ether resin, aramid resin or the like may be used. As for thermoplastic resins, for example, liquid crystal polymer (LCP), PEEK resin, PTFE resin (fluorine resin) or the like may be used. Such resins are preferred to be selected according to requirements such as insulation, dielectric properties, heat resistance and mechanical features. In addition, such resins may contain curing agents, stabilizers, fillers or the like as additives. Alternatively, instead of prepreg, RCF (Resin Coated copper Foil) or the like may also be used.

On the lower surface of substrate (100) (the side indicated by arrow (Y1)), wiring layer (110) is formed; and on the upper surface of substrate (100) (the side indicated by arrow (Y2)), wiring layer (120) is formed.

Wiring layer (110) has first wiring layer (111) and second wiring layer (112). In addition, wiring layer (120) has first wiring layer (121) and second wiring layer (122). First wiring layers (111, 121) are made of, for example, copper foil. Second wiring layers (112, 122) are made of, for example, copper-plated film. The thickness of wiring layers (110, 120) is, for example, in the range of 20-30 μm. Here, the material, thickness and so forth of wiring layers (110, 120) may be modified according to usage requirements or the like.

In space (R11) of insulation layer (101), electronic component (200) having approximately the same thickness as insulation layer (101) is arranged. Adhesive (200a) for securing electronic component (200), along with insulative resin (102a) that has seeped (drained) from insulation layers (101, 102), is filled in the boundary areas between electronic component (200) and substrate (100). Resin (102a) completely envelopes electronic component (200). In doing so, electronic component (200) is protected by resin (102a) while being fixed to a predetermined position.

Adhesive (200a) is made from insulative material, for example, NCP (nonconductive liquid polymer) or the like. In insulative adhesive (200a), via holes (201a, 202a), which are configured to taper, are formed. Specifically, in first wiring layer (111) and adhesive (200a), tapered penetrating holes (210a, 220a) are formed to be connected to electronic component (200). Via holes (201a, 202a) are formed in part of penetrating holes (210a, 220a). Also, in penetrating holes (210a, 220a), conductors (210b, 220b) are filled so as to continue to second wiring layer (112). Accordingly, in via holes (201a, 202a) which are part of penetrating holes (210a, 220a), conductors (210b, 220b) are also filled respectively. By means of conductors (210b, 220b) filled in via holes (201a, 202a), electronic component (200) and wiring layer (110) are electrically connected. Opening diameter (d1) on the lower side (the side indicated by arrow (Y1)) of penetrating holes (210a, 220a) is, for example, 60 μm; and opening diameter (d2) on the upper side (the side indicated by arrow (Y2)) of penetrating holes (210a, 220a) is, for example, 50 μm. In addition, the configuration of penetrating holes (210a, 220a) is not limited to a taper, but may be configured in any shape.

The diameter of via holes (201a, 202a) (for example, upper-side opening diameter (d2) of penetrating holes (210a, 220a)) is preferred to be in the range of 30-90 μm, more preferably, in the range of 50-60 μm. If the diameter of via hole (201a) or (202a) is too small, connection reliability will decrease. On the other hand, if the diameter of via hole (201a) or (202a) is too large, the required areas for terminal electrodes (210, 220) (electrode pads) of electronic component (200) will increase. Accordingly, it is difficult to arrange such electronic components (200) densely. However, if the diameter of via holes (201a, 202a) is in the above range, wiring board (10) with a built-in electronic component may be manufactured with fewer such disadvantages.

Depth (d3) of via holes (201a, 202a) is preferred to be in the range of 1-10 μm; more preferably such depth is set particularly at 5 μm. If the depth of via holes (201a, 202a) is too shallow, making uniform holes becomes difficult. On the other hand, if the depth of via holes (201a, 202a) is too deep, forming such via holes takes a long time, and productivity will decrease. However, if the depth of via holes (201a, 202a) is in the above range, wiring board (10) with a built-in electronic component may be manufactured with fewer such disadvantages.

The aspect ratio (depth/diameter) of via holes (201a, 202a) is preferred to be in the range of 0.01-0.35; more preferably such ratio is set particularly at 0.1. If the ratio is in such a range, the contact area of via hole (201a) or (202a) and adhesive (200a) decreases, and thus thermal stress on via hole (201a) or (202a) may be eased. Meanwhile, the bonding area between via hole (201a) or (202a) and terminal electrode (210) or (220) increases, and thus the connection reliability is high between via hole (201a) or (202a) and terminal electrode (210) or (220).

Figure 2:
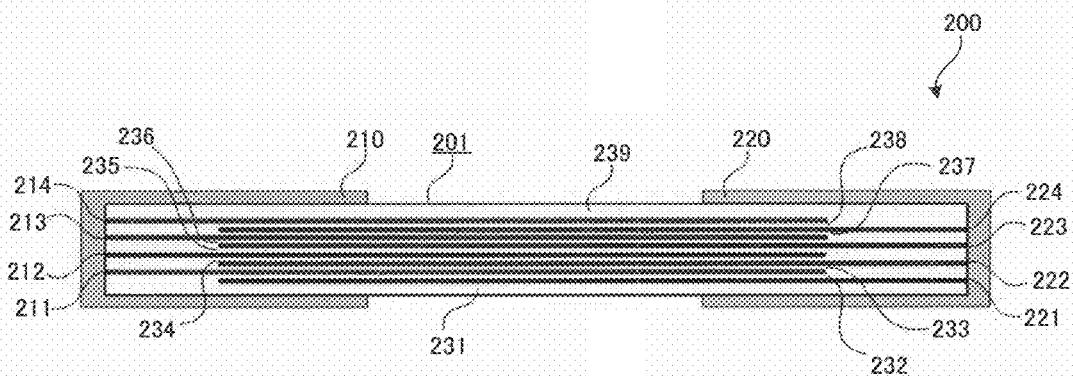
FIG. 2 is a cross-sectional view of an electronic component to be built into a wiring board as its built-in electronic component.

Electronic component (200) is, for example, a chip capacitor. Specifically, as its cross-sectional structure is shown in FIG. 2, for example, electronic component (200) has capacitor body (201) and U-shaped terminal electrodes (210, 220) (electrode pads). Capacitor body (201) is formed by alternately laminating, for example, multiple ceramic dielectric layers (231-239) and multiple conductive layers (211-214) and (221-224). Terminal electrodes (210, 220) are formed at the respective ends of capacitor body (201). Accordingly, capacitor body (201) is covered by terminal electrodes (210, 220) respectively at both of its ends, specifically in the areas of the lower surface, side surface and upper surface of each end. On the other hand, the central section of capacitor body (201) is exposed.

When built into substrate (100), the lower surfaces of terminal electrodes (210, 220) of electronic component (200) are connected to wiring layer (110) by means of via hole (201a) and conductor (210b), or via hole (202a) and conductor (220b) respectively as shown in FIG. 1. Here, second wiring layer (112) and conductors (210b, 220b) are made of, for example, copper-plated film. Thus, reliability at the connected portions of electronic component (200) and wiring layer (110) is high. Also, by forming plated film on the surface of terminal electrode (210) of electronic component (200), reliability at the connected portions of electronic component (200) and wiring layer (110) becomes even higher.

On the other hand, the central section of capacitor body (201) (FIG. 2) is coated with resin (102a). As such, by applying a coating of resin (102a) on the relatively fragile section of capacitor body (201) where the ceramic is exposed (central section), capacitor body (201) is protected by resin (102a).

The thickness of terminal electrodes (210, 220) (especially thickness (d4) on the lower-surface side to which conductors (210b, 220b) are connected) is preferred to be in the range of 5-15 μm, more preferably set particularly at 10 μm. If terminal electrodes (210, 220) become thinner, their strength decreases accordingly. Therefore, if terminal electrode (210) or (220) is too thin, when forming via hole (201a) or (202a) by laser or the like, such a drilling process may not stop at terminal electrode (210) or (220), but may bore into terminal electrode (210) or (220). On the other hand, if terminal electrode (210) or (220) is too thick, there may be a risk that cracks will occur in electric component (200). Besides, since wiring board (10) with a built-in electronic component becomes larger, sufficient mounting space or the like will become a concern. However, if the thickness of terminal electrodes (210, 220) is in the above range, wiring board (10) with a built-in electronic component may be formed having fewer disadvantages, seen from viewpoints such as strength or cracking.

Thickness (d5) of wiring layer (110) is preferred to be in the range of 20-40 μm, more preferably to be set particularly at 30 μm. If wiring layer (110) is too thin, electric resistance increases, which is not preferable for energy efficiency or the like. On the other hand, if wiring layer (110) is too thick, it takes a longer time when forming such layers, which is not preferable for manufacturing efficiency. Especially, when wiring layer (110) is formed by plating, disadvantages such as difficulty in depositing uniform plated film or difficulty in forming and removing plating resist may arise. However, if the thickness of wiring layer (110) is in the above range, wiring board (10) with a built-in electronic component may be manufactured with fewer disadvantages in energy efficiency and manufacturing efficiency.

In addition, the ratio between the thickness (especially lower-surface side thickness (d4)) of terminal electrode (210) or (220) and thickness (d5) of wiring layer (110) is preferred to be set so that the thickness of terminal electrode (210) or (220) is smaller than the thickness of wiring layer (110). Especially, it is more preferable for the thickness of terminal electrode (210) or (220) to be set at half (½) or smaller than the thickness of wiring layer (110). If the ratio is set to be such, terminal electrode (210) or (220) is made thinner, and cracking or the like may be suppressed accordingly from occurring in electronic component (200). On the other hand, if wiring layer (110) is made relatively thicker, thus supplementing the volume lost by thinner terminal electrode (210) or (220), high heat-radiation performance may be maintained.

Figure 3:
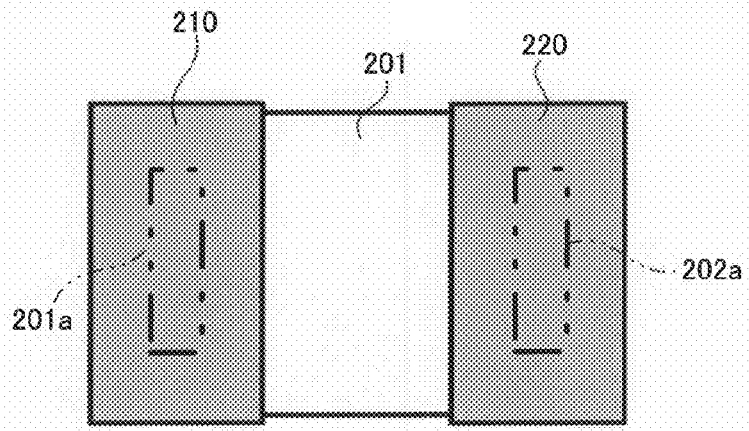
FIG. 3 is a view showing a positional relationship between a terminal electrode of an electronic component and a via hole.

Via holes (201a, 202a) are each arranged, for example, in the center of terminal electrode (210, 220) of electronic component (200) as shown in FIG. 3.

Figure 4:
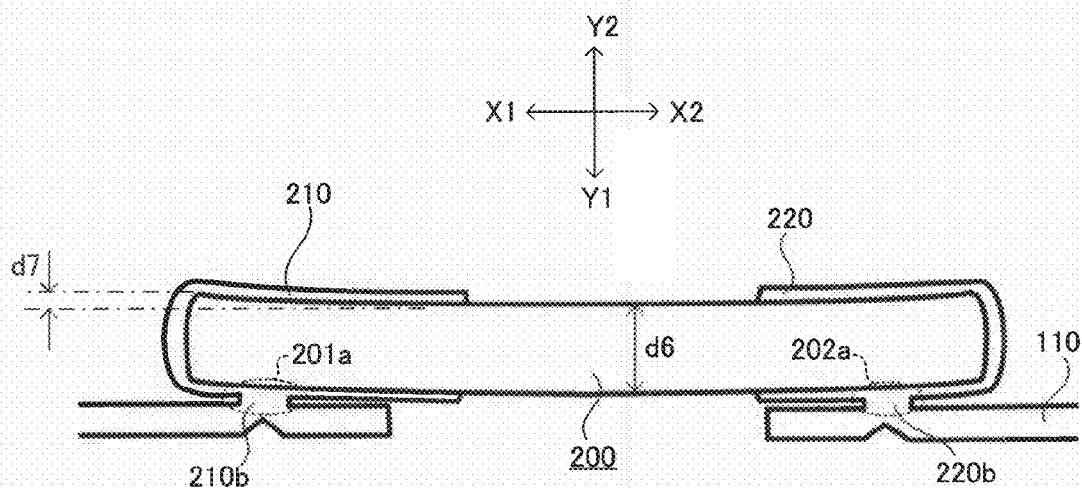
FIG. 4 is a magnified view of the electronic component to be built into a wiring board as its built-in electronic component.

FIG. 4 is a magnified view of electronic component (200). Electronic component (200) is configured to be, for example, 1 mm-square and thickness (d6) of electronic component (200) is, for example, in the range of 100-150 μm. Also, if the size of such chips is trending toward compactness, the impact of warping in electronic component (200) generated during the manufacturing process may not be ignored. Specifically, electronic component (200) protrudes toward second wiring layer (112) more at its central section than at both of its ends; namely, the electronic component warps in the direction of arrow (Y1). Via holes (201a, 202a) are connected to the warped lower surface (protruding surface) of electronic component (200). Resin (102a) seeps into any small space at the lower surface of electronic component (200). Warping degree (d7) of electronic component (200) is, for example, in the range of 5-10 μm.

Figure 5:
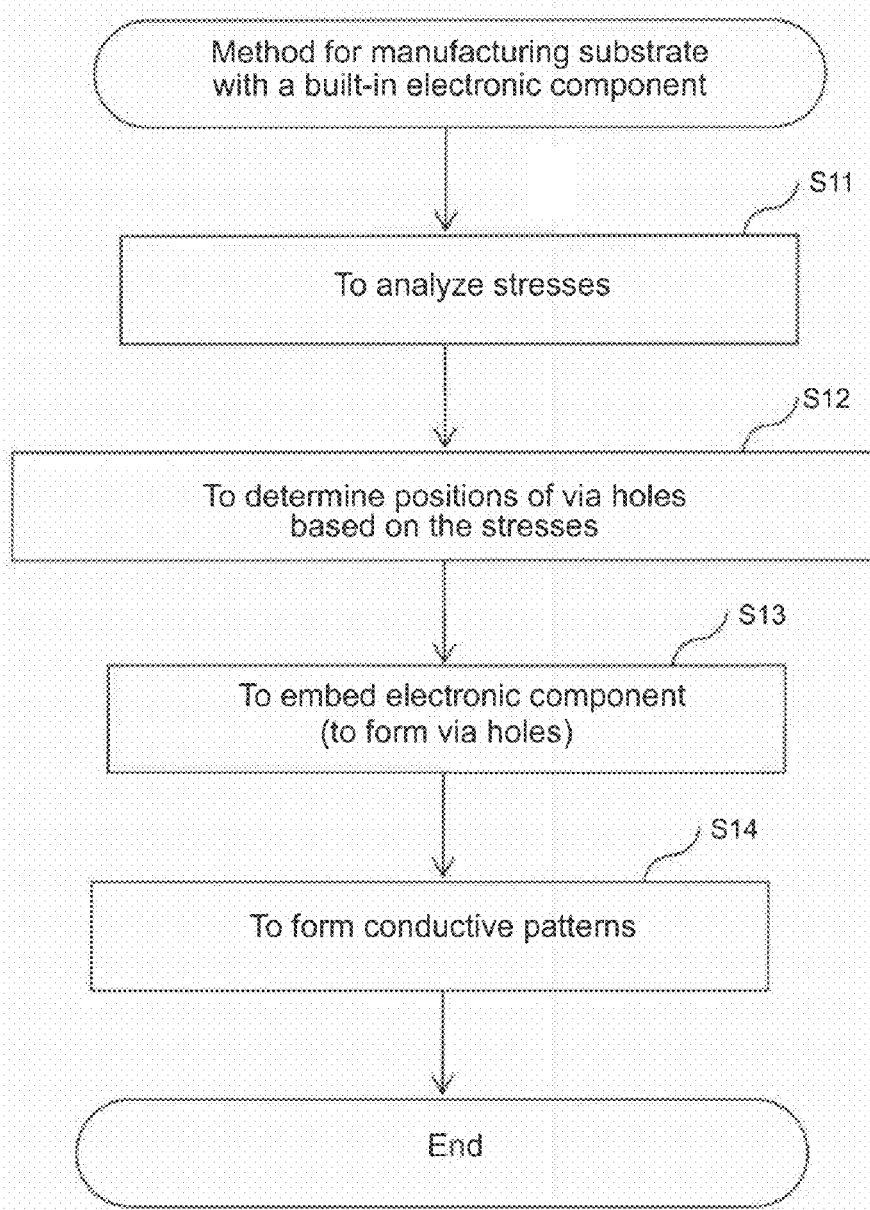
FIG. 5 is a flow chart showing the procedure of a method for manufacturing a wiring board with a built-in electronic component according to Embodiment (1) of the present invention.
Figure 6:
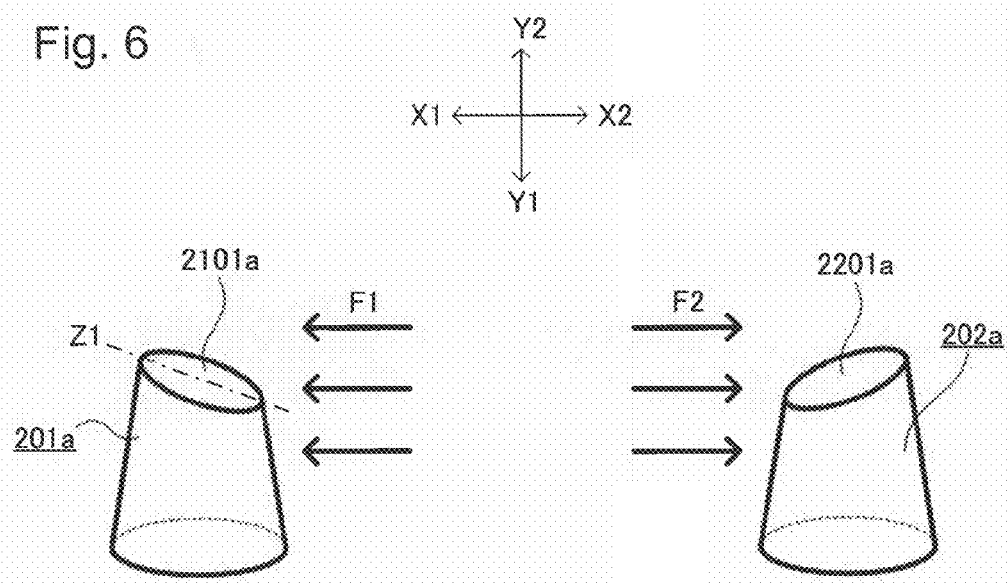
FIG. 6 is a view showing a relationship between directions of the forces generated in a substrate and the configuration of via holes.
Figure 7:
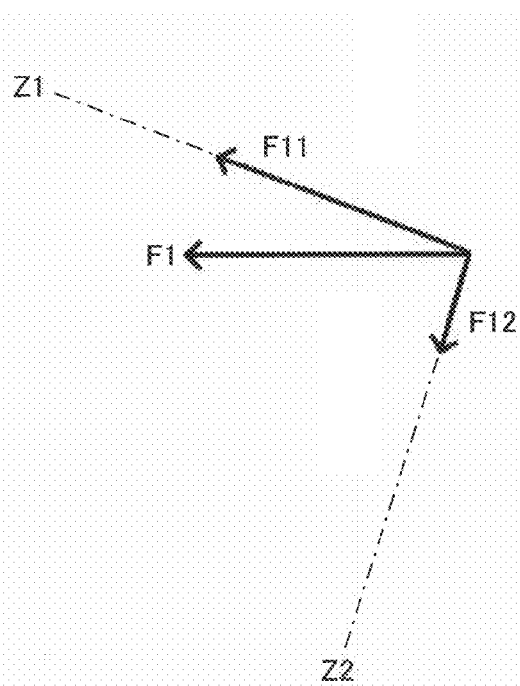
FIG. 7 is a view showing the forces generated in a substrate and the magnitude of component forces.

When manufacturing wiring board (10) with a built-in electronic component, a worker, for example, will carry out a series of processes as shown in FIG. 5.

In step (S11), the worker will analyze the stress in wiring board (10) with a built-in electronic component. Such a stress analysis is carried out using, for example, a simulator, according to a finite element method, a boundary element method or the like.

In step (S12), the worker will determine where to position via holes (201a, 202a) based on the analysis result in step (S11) (magnitude of stress, direction, distribution and so forth). Specifically, the worker will determine the positions of via holes (201a, 202a) by selecting either the protruding surface (lower surface) or recessed surface (upper surface) of the warped electronic component (200) for connection with via holes in the later process (step (S13)).

For example, according to the stress analysis in step (S11), if the obtained result shows that stresses (F1, F2) are generated to pull electronic component (200) in directions parallel to layers of wiring board (10) with a built-in electronic component (directions indicated by arrows (X1, X2)), via holes (201a, 202a) will be positioned in such a way that connection interfaces (2101a, 2201a) with electronic component (200) become inclined planes against stresses (F1, F2) respectively (planes inclined toward layer surfaces). Namely, via holes (201a, 202a) are positioned so that the lower surface (protruding surface) of electronic component (200) will become connection interfaces (2101a, 2202a).

By setting so, conductors (210b, 220b) inside via holes (201a, 202a) will receive stresses (F1, F2) at connection interfaces (2101a, 2201a) respectively. Namely, for example, stress (F1) will be distributed to shear stress (F11) in surface direction (Z1) along connection interface (2101a), and to stress (F12) in normal direction (Z2) of connection interface (2101a). Accordingly, shear stress (F11) based on stress (F1) will be added to surface direction (Z1) along connection interface (2101a). Since shear stress (F11) is a component of stress (F1), (F11) is smaller than (F1) (F11<F1). Meanwhile, the same applies to stress (F2); the stress added onto connection interface (2201 a) is a component stress (shear stress) smaller than stress (F2).

Accordingly, compared with a wiring board with a built-in electronic component in which connection interfaces (2101a, 2201 a) are parallel to layer surfaces, if stresses (F1, F2) are generated from temperature change, external force or the like, stresses distributed in surface direction (Z1) of connection interfaces (2101a, 2201 a) are smaller in wiring board (10) with a built-in electronic component. Therefore, connection interfaces (2101a, 2202a) between electronic component (200) and via holes (201a, 202a) will seldom fracture. Accordingly, in a heat-cycle with a temperature range of, for example, −25 to 140° C., the connection reliability of via holes (201a, 202a) is excellent in wiring board (10) with a built-in electronic component. Thus, the diameters of via holes (201a, 202a) may be made smaller.

In step (S13) of FIG. 5, the worker will embed electronic component (200) after conducting the steps shown in FIGS. (8A)-(8D) and FIGS. (9A)-(9C).

Figure 8A:
FIG. 8A is a view to illustrate a step to arrange an electronic component on a carrier.

Specifically, the worker will prepare carrier (1110) having conductive film (1111) on one surface as shown in FIG. 8A. Carrier (1110) and conductive film (1111) are made of, for example, copper. However, carrier (1110) is thicker than conductive film (1111).

Figure 8B:
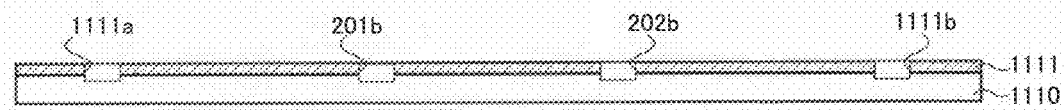
FIG. 8B is a view to illustrate a step to arrange an electronic component on a carrier.
Figure 8C:
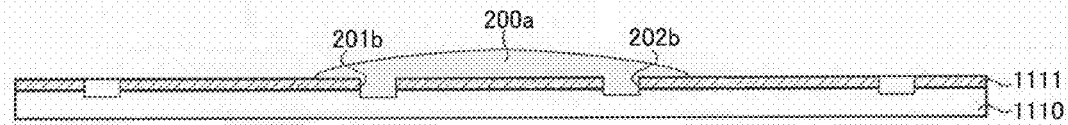
FIG. 8C is a view to illustrate a step to arrange an electronic component on a carrier.

The worker will drill holes by, for example, UV laser or the like, which penetrate only conductive film (1111) as shown in FIG. 8B. Accordingly, opening portions (201b, 202b, 1111a, 1111b) are formed. Opening portions (201b, 202b) are formed in the positions of via holes (201a, 202a) determined in step (S12) (a position-determination step). Opening portions (1111a, 1111b) are used as alignment targets.

The worker will apply adhesive (200a) using, for example, NCP coating or the like, to the central portion of carrier (1110) and conductive film (1111) including opening portions (201b, 202b). In doing so, adhesive (200a) is filled in opening portions (201b, 202b).

Figure 8D:
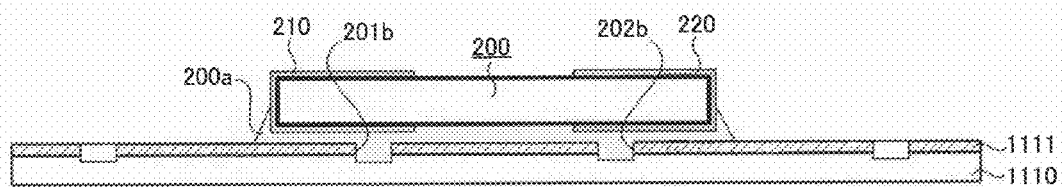
FIG. 8D is a view to illustrate a step to arrange an electronic component on a carrier.

The worker will mount electronic component (200) on opening portions (201b, 202b) as shown in FIG. 8D. Specifically, after electronic component (200) is mounted on adhesive (200a), the electronic component is fixed to the position by adding, for example, pressure or heat. During that time, electronic component (200) is pressed down so that the thickness of adhesive (200a) becomes uniform, and voids do not remain inside. Such a process is important to ensure the connection reliability of via holes (201a, 202a) in a later process.

Figure 9A:
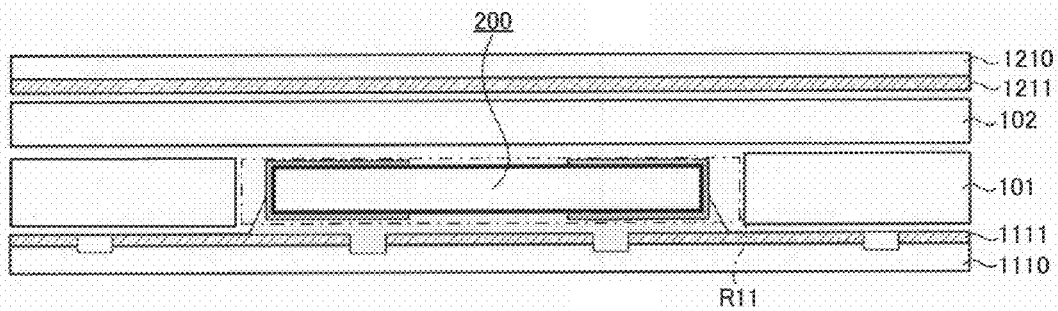
FIG. 9A is a view to illustrate a step to build (embed) an electronic component inside a substrate.

On carrier (1110) and conductive film (1111) made of, for example, copper, insulation layer (101) made of, for example, prepreg, is arranged along with electronic component (200); then, insulation layer (102) made of, for example, copper, and conductive film (1211) and carrier (1210) made of, for example, copper, are further arranged on top as shown in FIG. 9A. Accordingly, electronic component (200) is arranged in space (R11) at the center of insulation layer (101).

Figure 9B:
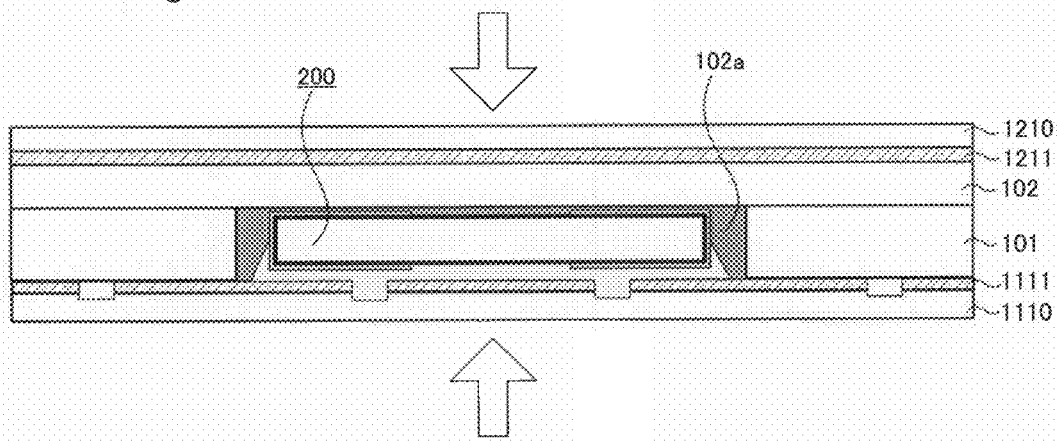
FIG. 9B is a view to illustrate a step to build an electronic component inside a substrate.

As shown in FIG. 9B, the worker will pressure-press (for example, thermal press) those arranged earlier. By doing so, resin (102a) is squeezed out from insulation layers (101, 102). Namely, by such pressing, resin (102a) seeps (is drained) from each prepreg that forms insulation layers (101, 102), and will be filled in a space (boundary area) between electronic component (200) and insulation layer (101). After that, insulation layers (101, 102) are cured by thermal treatment, for example.

Figure 9C:
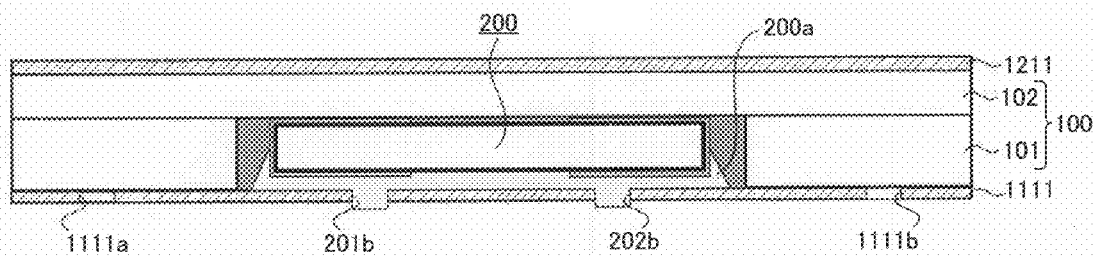
FIG. 9C is a view to illustrate a step to build an electronic component inside a substrate.

The worker will remove carriers (1110, 1210) as shown in FIG. 9C, for example. By doing so, conductive films (1111, 1211) and adhesive (200a) filled in opening portions (201b, 202b) are exposed.

Accordingly, electronic component (200) is embedded in substrate (100). Electronic component (200) is arranged in the hollow section (space (R11)) of substrate (100).

In step (S14) of FIG. 5, the worker will form conductive patterns by performing steps shown, for example, in FIGS. (10A)-(10C).

Figure 10A:
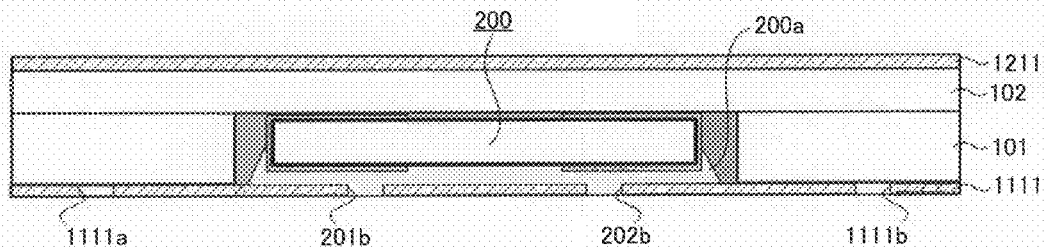
FIG. 10A is a view to illustrate a step to form a conductive pattern.
Figure 10B:
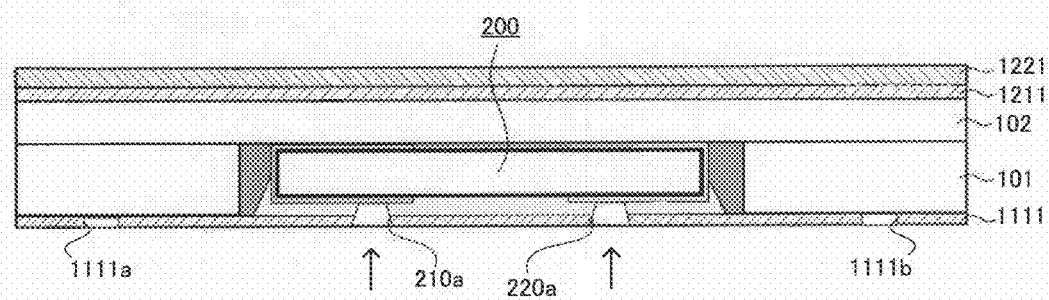
FIG. 10B is a view to illustrate a step to form a conductive pattern.

Specifically, the worker will conduct $CO_2$ laser cleaning and desmearing as shown, for example, in FIG. 10A. By doing so, adhesive (200a) is removed from the surface of conductive film (1111).

The worker will form penetrating holes (210a, 220a) reaching electronic component (200) in conductive film (1111) and adhesive (200a) using, for example, a laser or the like. By doing so, via holes (201a, 202a) are formed as part of penetrating holes (210a, 220a).

Figure 10C:
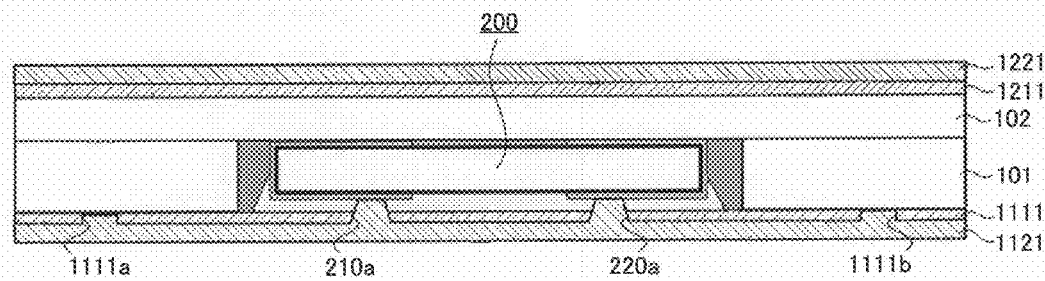
FIG. 10C is a view to illustrate a step to form a conductive pattern.

The worker will perform PN plating (for example, chemical copper plating and copper electroplating) to form conductive films (1121, 1221) (copper-plated films) on the surfaces of conductive films (1111, 1211) including penetrating holes (210a, 220a) and opening portions (1111a, 1111b) as shown, for example, in FIG. 10C.

The worker will make conductive films (1121, 1221) thinner by, for example, half etching, to a predetermined thickness. Then, through a predetermined lithography process (preliminary treatment, laminating, exposing and developing, etching, removing, inner-layer inspection and so forth), conductive films (1111, 1121, 1211, 1221) are patterned as shown in FIG. 1 earlier. By doing so, first wiring layer (111) and second wiring layer (112) (wiring layer 110), along with first wiring layer (121) and second wiring layer (122) (wiring layer 120) are formed. Instead of using a subtractive method to form conductive patterns, another method, a so-called semi-additive (SAP) method may also be used: namely, plating resist is formed on insulation layers (101, 102), and then wiring layers (110, 120) are formed by pattern plating (for example, chemical copper plating and copper electroplating). Also, prior to forming conductive patterns, openings penetrating insulation layers (101, 102) are formed, and then at the same time when forming wiring layers (110, 120), through-holes are formed by plating in such opening portions.

Furthermore, according to requirements, the worker will form electrodes by, for example, chemical gold plating or the like; conduct exterior processing; correct warping; inspect conductivity; inspect the external appearance; and conduct a final inspection. By doing so, wiring board (10) with a built-in electronic component is completed as shown earlier in FIG. 1.

According to wiring board (10) with a built-in electronic component and its manufacturing method of the present embodiment, without complicating the steps to form via holes (201a, 202a), degradation caused by stresses generated in substrate (100) may be suppressed in wiring board (10) with a built-in electronic component.

In the manufacturing method according to the present embodiment, the positions of via holes (201a, 202a) are determined in step (S12) based on the stresses generated in substrate (100). Accordingly, wiring board (10) with a built-in electronic component may be mass produced featuring via holes (201a, 202a) with excellent connection reliability.

Moreover, based on the stresses generated in substrate (100), the positions of via holes may be determined by selecting either the protruding surface or the recessed surface of the warped electronic component (200) for connection with via holes. Thus, without complicating the manufacturing process (especially a step to determine the positions), tolerance to stress may be easily enhanced.

Embodiment (2)

Figure 11A:
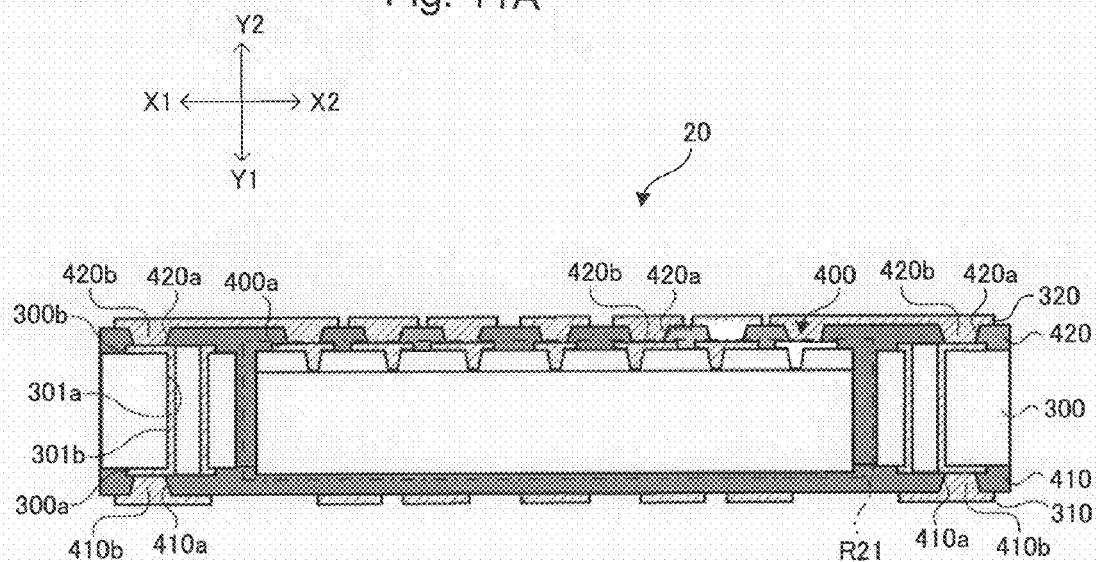
FIG. 11A is a cross-sectional view of a wiring board with a built-in electronic component according to Embodiment (2) of the present invention.

As shown in FIG. 11A, wiring board (20) with a built-in electronic component of the present embodiment has substrate (300), wiring layers (310, 320) as conductive patterns, and electronic component (400). Electronic component (400) is built into wiring board (20) as its built-in component. Electronic component (400) is an IC chip where predetermined circuits are integrated. Electronic component (400) has multiple terminal electrodes (400a) (electrode pads) on one surface. However, the structure is not limited to such, and electronic component (400) may have terminal electrodes (400a) on both of its surfaces, for example. An IC chip referred to here includes a so-called wafer level CSP, which is formed by rewiring, forming protective films and terminals on wafers, then separating the wafers into units.

Substrate (300) is made from, for example, epoxy resin. Epoxy resin is preferred to contain reinforcing material such as glass cloth. Reinforcing material has a smaller thermal expansion coefficient than main material (epoxy resin). The thickness of substrate (300) is, for example, 0.1 mm. However, the configuration, thickness, material and so forth of substrate (300) may be modified according to usage requirements or the like.

Substrate (300) has through-holes (301a). On the inner walls of through-holes (301a), conductive film (301b) is formed. In addition, substrate (300) has space (R21) whose configuration corresponds to the external shape of electronic component (400).

On both surfaces of substrate (300), wiring layers (300a, 300b) are formed respectively. Wiring layer (300a) and wiring layer (300b) are electrically connected to each other by means of conductive films (301b) formed in through-holes (301a).

On the lower surface of substrate (300) (the side indicated by arrow (Y1)), insulation layer (410) and wiring layer (310) are laminated in that order. Also, on the upper surface of substrate (300) (the side indicated by arrow (Y2)), insulation layer (420) and wiring layer (320) are laminated in that order. Insulation layers (410, 420) are made of, for example, cured prepreg. Also, wiring layers (310, 320) are made of, for example, copper-plated film.

Electronic component (400) is arranged in space (R21). In the boundary areas of electronic component (400) and substrate (300), insulation layer (420) is filled.

Insulation layer (410) is formed to cover the lower surface of electronic component (400) and wiring layer (300a). Here, at the predetermined spots, via holes (410a) in a tapered shape are formed so as to be connected to wiring layer (300a). In via holes (410a), conductor (410b) is filled. Then, by means of conductors (410b), wiring layer (300a) and wiring layer (310) are electrically connected.

Meanwhile, insulation layer (420) is formed to cover the upper surface of electronic component (400), wiring layer (300b) and terminal electrodes (400a). Here, at the predetermined spots, via holes (420a) in a tapered shape are formed to be connected to wiring layer (300b) and terminal electrodes (400a). In via holes (420a), conductor (420b) is filled. Then, by means of conductors (420b), wiring layer (300b), terminal electrodes (400a) and wiring layer (320) are electrically connected. Here, wiring layer (320) and conductors (420b) are made of, for example, copper-plated film. Therefore, reliability is high in the connection areas between electronic component (400) and wiring layer (320).

Electronic component (400) is completely enveloped by insulation layers (410, 420). In doing so, electronic component (400) is protected by insulation layers (410, 420) while being fixed to a predetermined position.

Figure 11B:
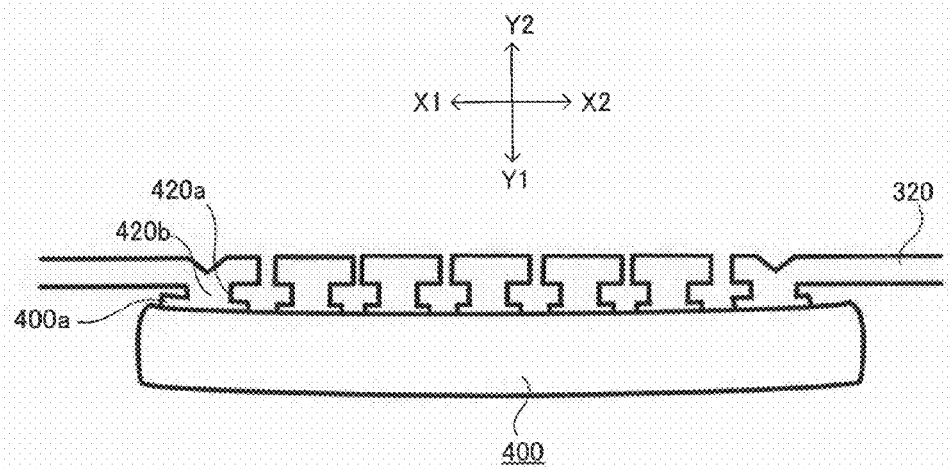
FIG. 11B is a magnified view of the electronic component to be built into the wiring board as its built-in electronic component.

As electronic components are becoming thinner, electronic component (400) may tend to warp as shown in, for example, FIG. 11B (which corresponds to FIG. 4). In the present embodiment, by forecasting a case in which stresses are generated in a direction to compress electronic component (400), via holes (420a) are connected to the recessed surface of electronic component (400). Electronic component (400) of the present embodiment warps in such a way that it is recessed relative to wiring layer (320) more at its central section than at both of its ends; namely, in a direction indicated by arrow (Y1).

Wiring board (20) with a built-in electronic component may also be manufactured by a worker who will conduct a series of steps shown earlier in FIG. 5. In step (S11), the worker will first analyze stresses in wiring board (20) with a built-in electronic component. Such a stress analysis is carried out using, for example, a simulator, according to a finite element method, a boundary element method, or the like. In step (12), the worker will determine where to position via holes (420a) (especially via holes (420a) to be connected to terminal electrodes (400a)) based on the analysis results in step (S11) (magnitude of stress, direction, distribution and so forth).

In step (S13), the worker will embed electronic component (400) after conducting the processes shown, for example, in FIGS. (12A)-(12D) and FIGS. (13A)-(13C).

Figure 12A:
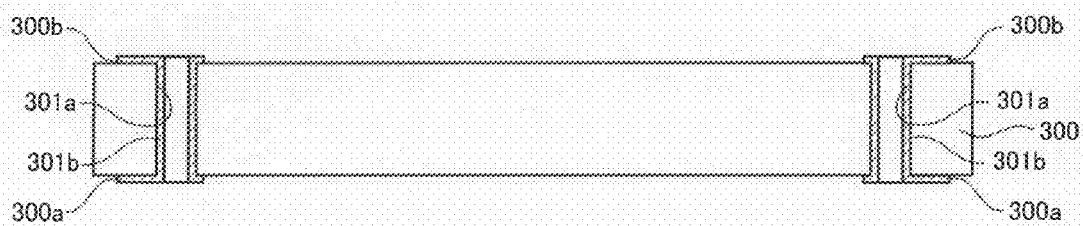
FIG. 12A is a view to illustrate a step to prepare a substrate.

Specifically, the worker will prepare substrate (300) having through-holes (301a), conductive films (301b) and wiring layers (300a, 300b) as shown, for example, in FIG. 12A. Substrate (300) corresponds to a core of wiring board (20) with a built-in electronic component.

Figure 12B:
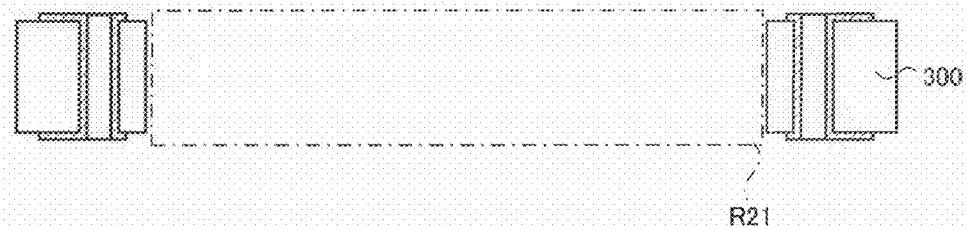
FIG. 12B is a view to illustrate a step to form a space to build an electronic component in the substrate.

The worker will form space (R21) in substrate (300) by cutting out a hole using a laser or the like as shown, for example, in FIG. 12B.

Figure 12C:
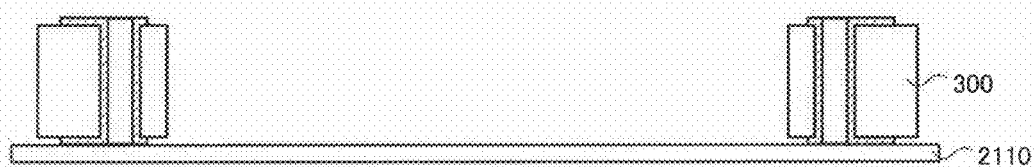
FIG. 12C is a view to illustrate a step to mount the substrate on a carrier.
Figure 12D:
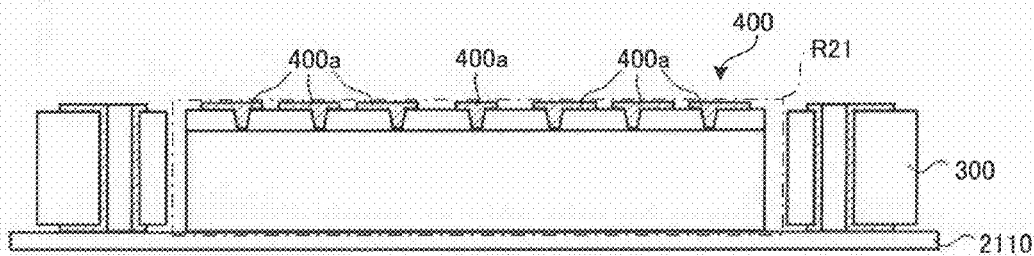
FIG. 12D is a view to illustrate a step to arrange an electronic component on the carrier.

The worker will arrange carrier (2110) made of, for example, PET (polyethylene telephtharate) on one side of substrate (300) as shown, for example, in FIG. 12C. Carrier (2110) is adhered to substrate (300) by lamination, for example.

The worker will mount electronic component (400) on carrier (2110) (specifically in space (R21)), for example, at room temperature in such a way that terminal electrodes (400a) of electronic component (400) face upward (the opposite side of carrier (2110)).

Figure 13A:
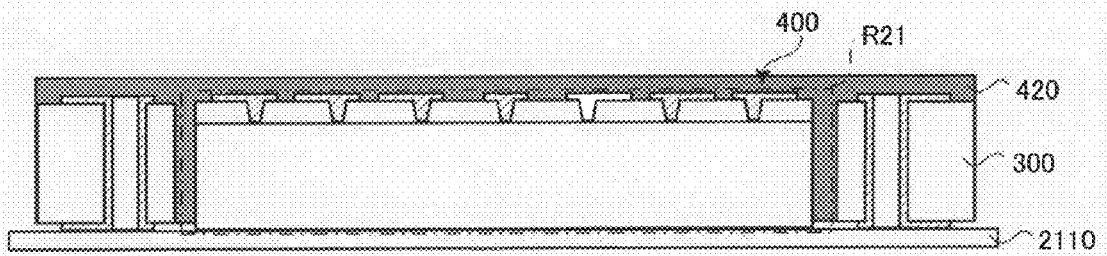
FIG. 13A is a view to illustrate a step to build (embed) an electronic component into the substrate.

The worker will form insulation layer (420) to cover electronic component (400) and substrate (300) using, for example, a vacuum laminator as shown in FIG. 13A. In doing so, terminal electrodes (400a) are covered by insulation layer (420). Moreover, insulation layer (420) melts when heated and is filled in space (R21). Accordingly, electronic component (400) is fixed to a predetermined position.

Figure 13B:
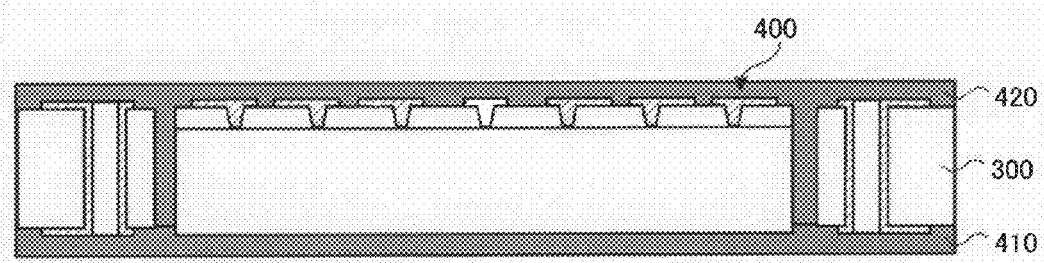
FIG. 13B is a view to illustrate a step to build an electronic component into the substrate.

The worker will peel carrier (2110) from the lower surface (the surface opposite insulation layer (420)) of substrate (300) and remove the carrier. As shown, for example, in FIG. 13B, insulation layer (410) is formed on the lower surface of substrate (300). In doing so, electronic component (400) is embedded.

Figure 13C:
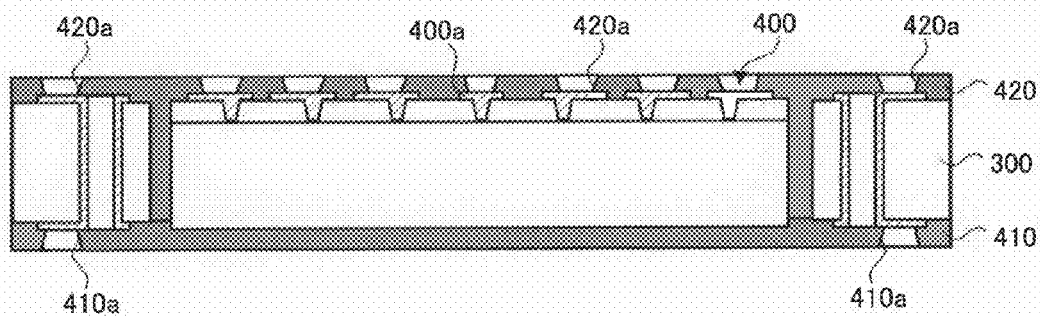
FIG. 13C is a view to illustrate a step to form a via hole.

As shown in FIG. 13C, the worker will form via holes (410a, 420a) in insulation layers (410, 420) by laser, for example.

In step (S14) of FIG. 5, the worker will form conductive patterns, namely, wiring layers (310, 320) in electronic component (400) using, for example, a semi-additive method.

Specifically, both surfaces of electronic component (400) will be covered with a patterned plating resist, and electrolytic plating will be performed selectively on areas where the resist is not formed. Instead of such a semi-additive method, wiring layers (310, 320) may also be formed by a subtractive method.

According to requirements, the worker will form electrodes by, for example, chemical gold plating or the like; conduct exterior processing; correct warping; inspect conductivity; inspect the external appearance; and conduct a final inspection. By doing so, wiring board (20) with a built-in electronic component is completed as shown earlier in FIG. 11A.

Substantially the same effects as those of Embodiment (1) described above will also be achieved in wiring board (20) with a built-in electronic component and its manufacturing method according to the present embodiment.

So far, wiring boards with a built-in electronic component and their manufacturing method according to the embodiments of the present invention have been described. However, the present invention is not limited to such embodiments.

Figure 14:
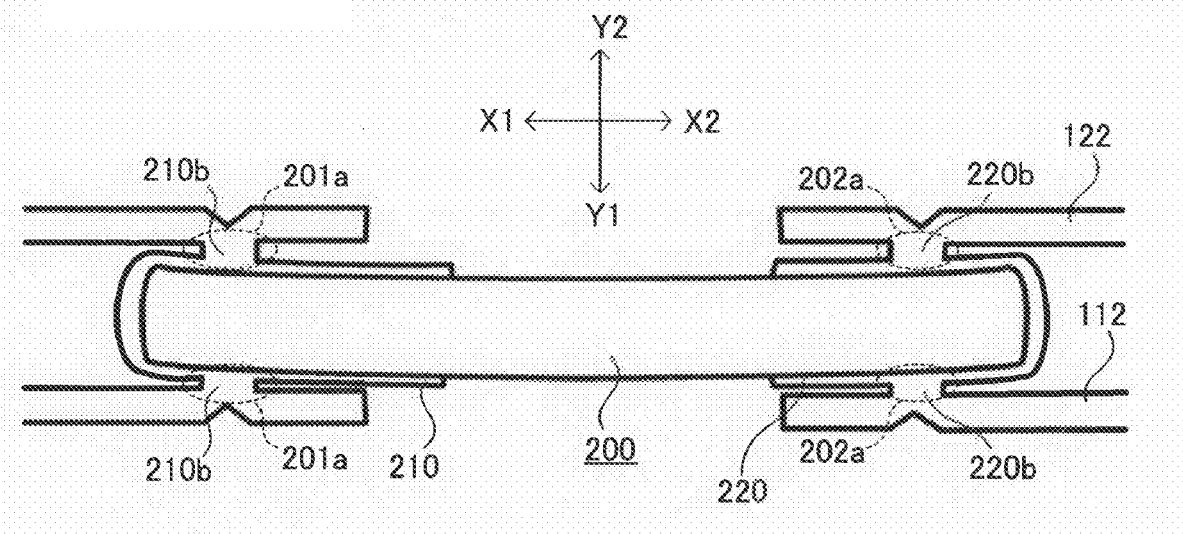
FIG. 14 is a view showing another example for arranging via holes.

Also, in each of the above embodiments, based on the stresses generated in substrates, the positions of via holes were determined by selecting either the protruding surface or the recessed surface of the warped electronic component for connection with via holes. However, the present invention is not limited to such. Depending on the stresses generated in the substrate, via holes (201a, 202a) may be connected to both surfaces (protruding side and recessed side) of electronic component (200) as shown, for example, in FIG. 14 (which corresponds to FIG. 4). The same is applied to electronic component (400).

Figure 15A:
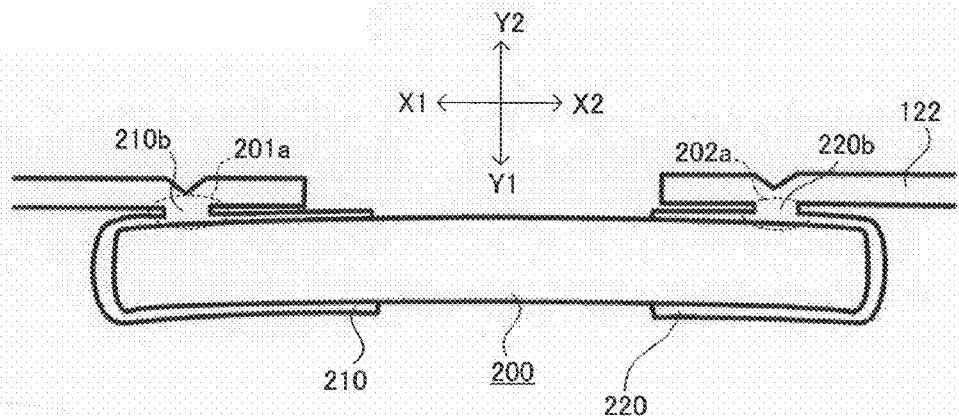
FIG. 15A is a view showing another example for arranging an electronic component.
Figure 15B:
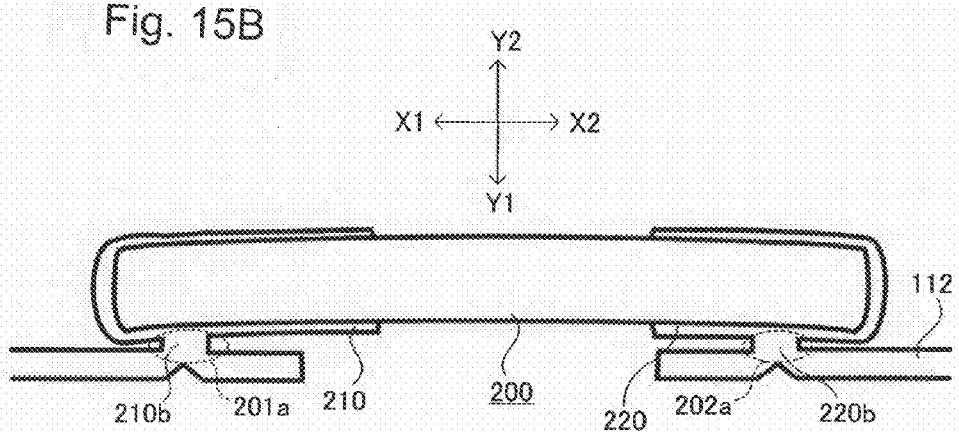
FIG. 15B is a view showing yet another example for arranging an electronic component.
Figure 15C:
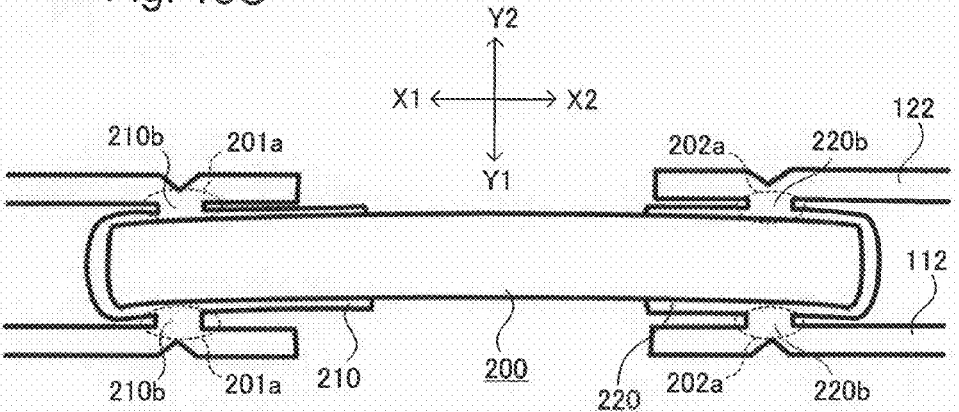
FIG. 15C is a view showing yet another example for arranging an electronic component.

Electronic component (200) may be arranged with its protruding surface upward (the direction indicated by arrow (Y2)) as shown in, for example, FIGS. 15A-15C (which correspond to FIG. 4). In such a case, as shown in FIG. 15A or FIG. 15B, for example, via holes (201a, 202a) may be formed on one side (upper surface or lower surface); alternatively, as shown in FIG. 15C, for example, via holes (201a, 202a) may be formed on both surfaces. The same is applied to electronic component (400).

Figure 16A:
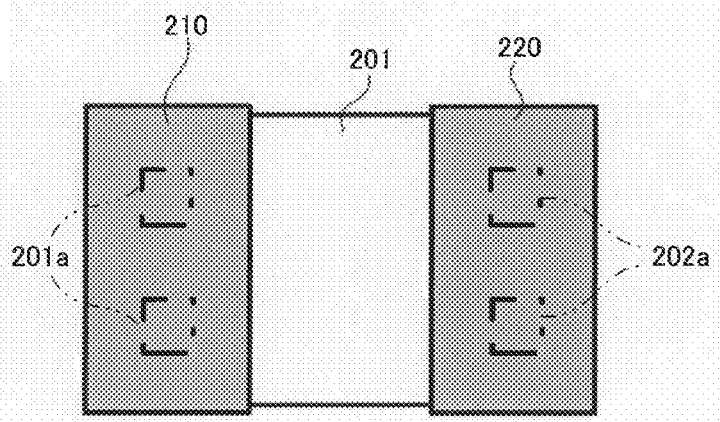
FIG. 16A is a view showing another example of how terminal electrodes of an electronic component and via holes are configured.
Figure 16B:
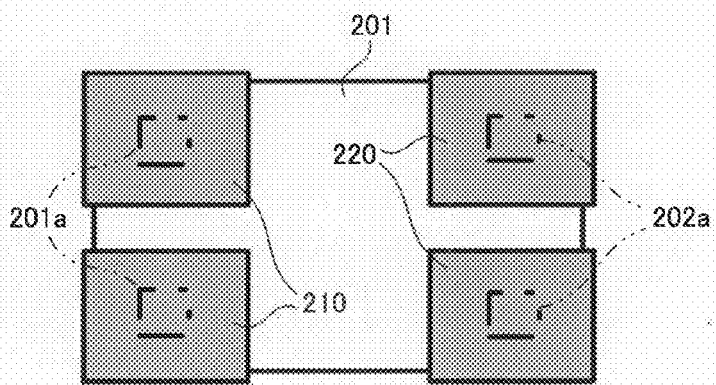
FIG. 16B is a view showing yet another example of how terminal electrodes of an electronic component and via holes are configured.
Figure 16C:
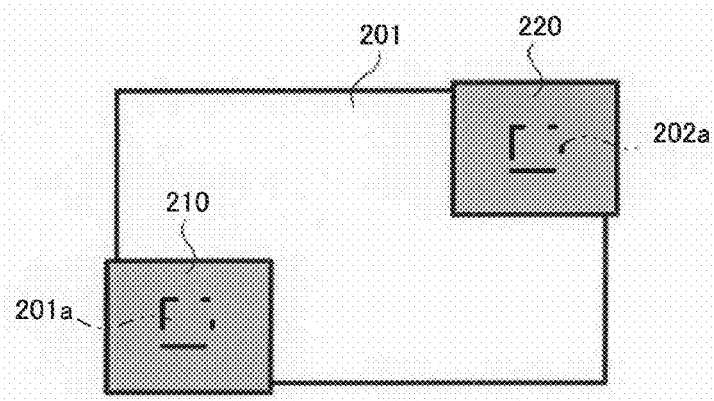
FIG. 16C is a view showing yet another example of how terminal electrodes of an electronic component and via holes are configured.

There is no specific number or configuration for the terminal electrodes of an electronic component or via holes. For example, in Embodiment (1), via holes (201a, 202a) are formed one each in their respective terminal electrodes (210, 220). However, as shown in FIG. 16A (which corresponds to FIG. 3), for example, multiple (for example, two) via holes (201a, 202a) may be formed respectively in terminal electrodes (210, 220). Alternatively, as shown in FIG. 16B, for example, terminal electrodes (210, 220) along with their respective via holes (201a, 202a) may be arranged at the four corners of capacitor body (201). Yet alternatively, as shown in FIG. 16C, for example, terminal electrodes (210, 220) along with their respective via holes (201a, 202a) may be arranged diagonally in capacitor body (201). The same is applied to Embodiment (2).

Figure 17A:
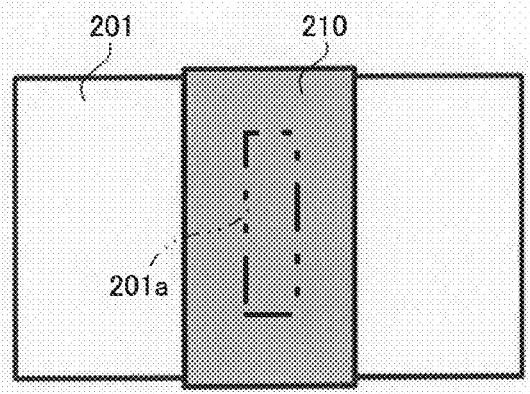
FIG. 17A is a view showing yet another example of how a terminal electrode of an electronic component and a via hole are configured.
Figure 17B:
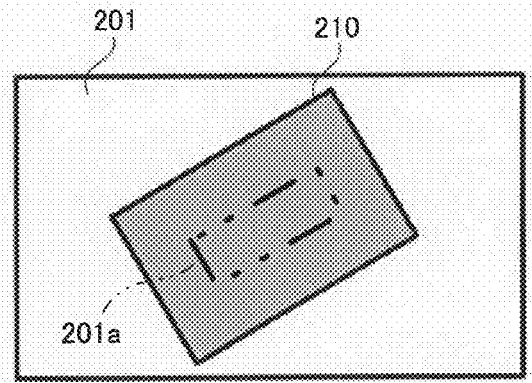
FIG. 17B is a view showing yet another example of how a terminal electrode of an electronic component and a via hole are configured.
Figure 17C:
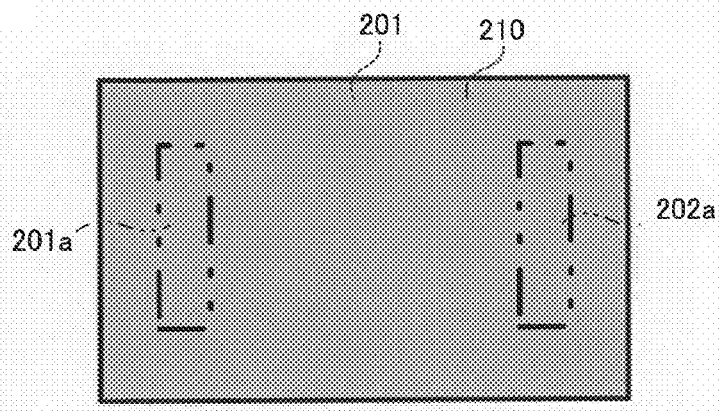
FIG. 17C is a view showing yet another example of how a terminal electrode of an electronic component and via holes are configured.

To efficiently enhance tolerance to stress, it is preferred that via holes (201a, 202a) be connected on at least one end of electronic component (200) either to both surfaces of the warped electronic component or to one surface. However, the present invention is not limited to such, for example, as shown in FIG. 17A, terminal electrode (210) and via hole (201a) may be arranged at the central section of capacitor body (201). Alternatively, for example, as shown in FIG. 17B, terminal electrode (210) and via hole (201a) may be arranged diagonally to the sides of capacitor body (201). Yet alternatively, as shown in FIG. 17C, for example, terminal electrode (210) may be arranged on the entire surface of capacitor body (201).

The configuration of terminal electrodes (210, 220) of electronic component (200) is not limited to a U-shape, but a pair of electrodes may sandwich capacitor body (201).

Any type of electronic component may be employed as electronic components (200, 400). For example, other than active components such as an IC chip, passive components such as capacitors, resistors or coils may be used.

In the above embodiments, the material and size of each layer, the number of layers and so forth may be modified in any way.

For example, to reduce manufacturing costs or the like, wiring boards (10, 20) with a built-in component having a simple structure as shown earlier in FIG. 1 or FIG. 11A have an advantage. However, the present invention is not limited to such. For example, to achieve high functionality or the like, after the structure shown in FIG. 1 or FIG. 11A is completed, more layers may be laminated to make a further multilayered (for example eight layers) wiring board with a built-in electronic component.

The order of the steps in the above embodiments may be modified within a scope that will not deviate from the gist of the present invention. Also, according to usage requirements or the like, unnecessary steps may be omitted.

So far, the embodiments of the present invention have been described. It should be understood that various modifications and combinations necessary to be made according to design requirements or other factors be included in the present invention described in the "claims" or the scope of the invention corresponding to specific examples described in the "embodiments of the invention."

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a substrate;
an electronic component arranged in the substrate;
a via hole structure comprising a conductor and connected to the electronic component; and
a wiring layer comprising a conductive pattern connected to the electronic component through the via hole structure,
wherein the via hole structure and the electronic component have a connection interface which is inclined with respect to a connection interface formed between the via hole structure and the conductive pattern.

2. The wiring board according to claim 1, wherein the conductive pattern is formed on the substrate.

3. The wiring board according to claim 1, wherein the electronic component has a warped surface, and the via hole structure is connected to the warped surface of the electronic component.

4. The wiring board according to claim 3, wherein the warped surface of the electronic component protrudes or is recessed relative to the wiring layer more at a central portion of the electronic component than at end portions of the electronic component.

5. The wiring board according to claim 1, further comprising an adhesive layer securing the electronic component to the substrate, wherein the via hole structure is formed in the adhesive layer.

6. The wiring board according to claim 1, wherein the wiring layer comprises a plated film.

7. The wiring board according to claim 1, wherein the electronic component is a capacitor.

8. The wiring board according to claim 7, wherein the capacitor has a capacitor body comprising a plurality of dielectric layers and a plurality of conductive layers and a plurality of electrodes formed on the capacitor body.

9. A wiring board, comprising:
a substrate;
an electronic component arranged in the substrate;
a via hole structure comprising a conductor and connected to the electronic component; and
a laminated structure laminated on the substrate and comprising a plurality of wiring layers and a plurality of insulation layers,
wherein the plurality of wiring layers includes a wiring layer comprising a conductive pattern connected to the electronic component through the via hole structure, the via hole structure and the electronic component have a connection interface which is inclined with respect to a connection interface formed between the via hole structure and the conductive pattern.

10. The wiring board according to claim 9, wherein the conductive pattern is formed on the substrate.

11. The wiring board according to claim 9, wherein the electronic component has a warped surface, and the via hole structure is connected to the warped surface of the electronic component.

12. The wiring board according to claim 11, wherein the warped surface of the electronic component protrudes or is recessed relative to the wiring layer more at a central portion of the electronic component than at end portions of the electronic component.

13. The wiring board according to claim 9, further comprising an adhesive layer securing the electronic component to the substrate, wherein the via hole structure is formed in the adhesive layer.

14. The wiring board according to claim 9, wherein the wiring layer comprises a plated film.

15. The wiring board according to claim 9, wherein the electronic component is a capacitor.

16. The wiring board according to claim 15, wherein the capacitor has a capacitor body comprising a plurality of dielectric layers and a plurality of conductive layers and a plurality of electrodes formed on the capacitor body.

17. A method for manufacturing a wiring board, comprising:
accommodating a warped electronic component inside a substrate;
forming a via hole structure comprising a conductor and connected to a warped surface of the electronic component; and
forming a wiring layer comprising a conductive pattern such that the conductive pattern is connected to the electronic component through the via hole structure,
wherein the via hole structure and the electronic component form a connection interface which is inclined with respect to a connection interface formed between the via hole structure and the conductive pattern.

18. The method for manufacturing a wiring board according to claim 17, further comprising determining a position of the via hole structure based on stress acting on the substrate before the forming of the via hole structure.

19. The method for manufacturing a wiring board according to claim 17, further comprising determining a surface of the electronic component to be connected by the via hole structure based on stress acting on the substrate before the forming of the via hole structure.

20. The method for manufacturing a wiring board according to claim 17, wherein the forming of the wiring layer comprises forming a plated film.

\* \* \* \* \*